United States Patent [19]
Shafie

[11] Patent Number: 6,018,238
[45] Date of Patent: Jan. 25, 2000

[54] HYBRID NON-CONTACT CLAMP-ON CURRENT METER

[75] Inventor: Matt H. Shafie, Casselberry, Fla.

[73] Assignee: Bell Technologies Inc., Orlando, Fla.

[21] Appl. No.: 08/653,134

[22] Filed: May 24, 1996

Related U.S. Application Data

[63] Continuation-in-part of application No. 08/399,710, Mar. 3, 1995, Pat. No. 5,767,667.

[51] Int. Cl.$^7$ .............................. G01R 33/00; G01R 1/20
[52] U.S. Cl. ...................................... 324/117 R; 324/127
[58] Field of Search .............................. 324/127, 117 R, 324/129, 149; 336/175, 212, 176

[56] References Cited

U.S. PATENT DOCUMENTS 3,007,106 10/1961 Bergh et al. ............................. 324/127
5,552,979 9/1996 Gu et al. ............................... 324/117 R

*Primary Examiner*—Ernest Karlsen
*Attorney, Agent, or Firm*—Stein, Schifino & Van Der Wall

[57] ABSTRACT

A magnetic core for a hybrid non-contact current meter having a magnetic core that is adapted for encircling a current carrying conductor wherein the magnetic core includes a first portion having a first integral toroidal section and a first pair of opposing side walls extending therefrom, a second portion having a second integral toroidal section and a second pair of opposing side walls extending therefrom such that the first portion and second portion are coupled together so to define an aperture between the first and second pairs of opposing side walls. The first and second integral toroidal sections are designed so to be void of any discontinuities within the flow path of the magnetic flux and to have a circular shape so to promote a more thorough flux saturation whereby a reduction of zero errors results and more accurate current measurement are obtained. The hybrid non-contact current meter further includes a drive circuit for saturating the magnetic core and a switch control circuit which activates first and second switches so to automatically change the mode of operation from a low frequency mode employing a saturation technique to a high frequency mode employing a current transformer technique.

24 Claims, 9 Drawing Sheets

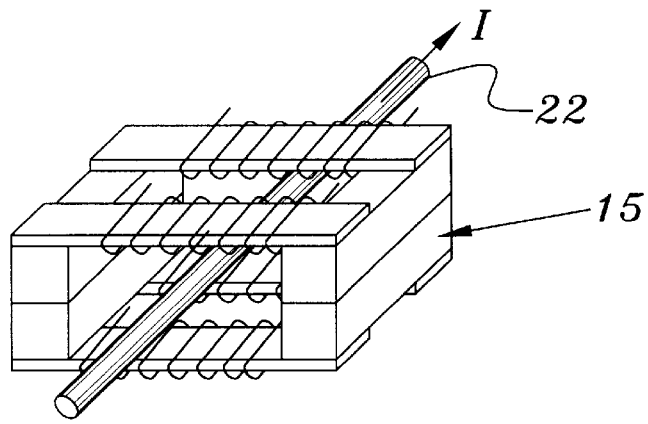
FIG. 1a
(Prior Art)
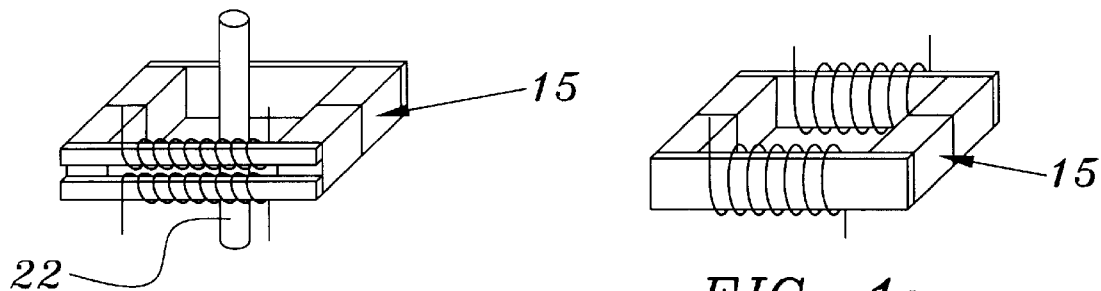
FIG. 1b
(Prior Art)
FIG. 1c
(Prior Art)
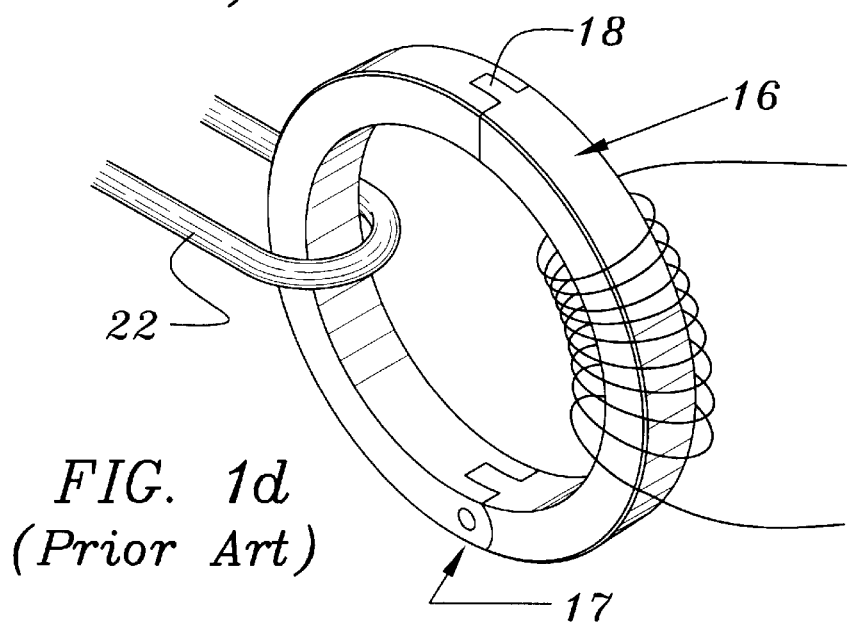
FIG. 1d
(Prior Art)

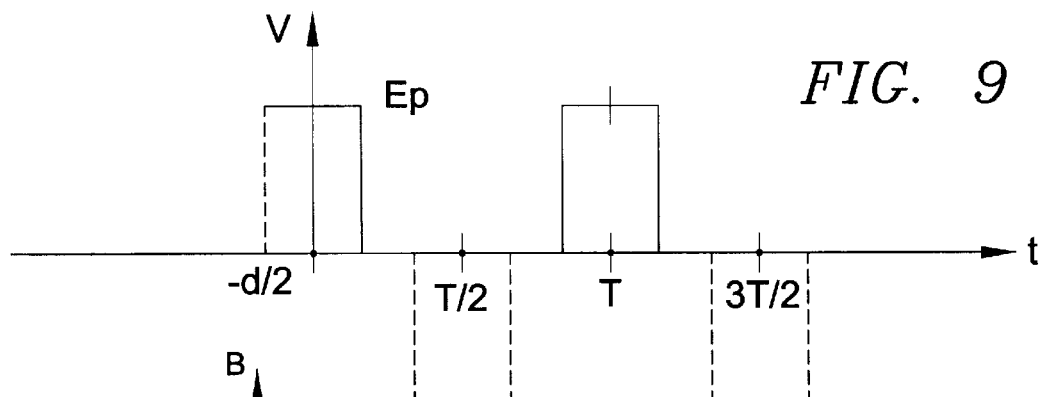
FIG. 9
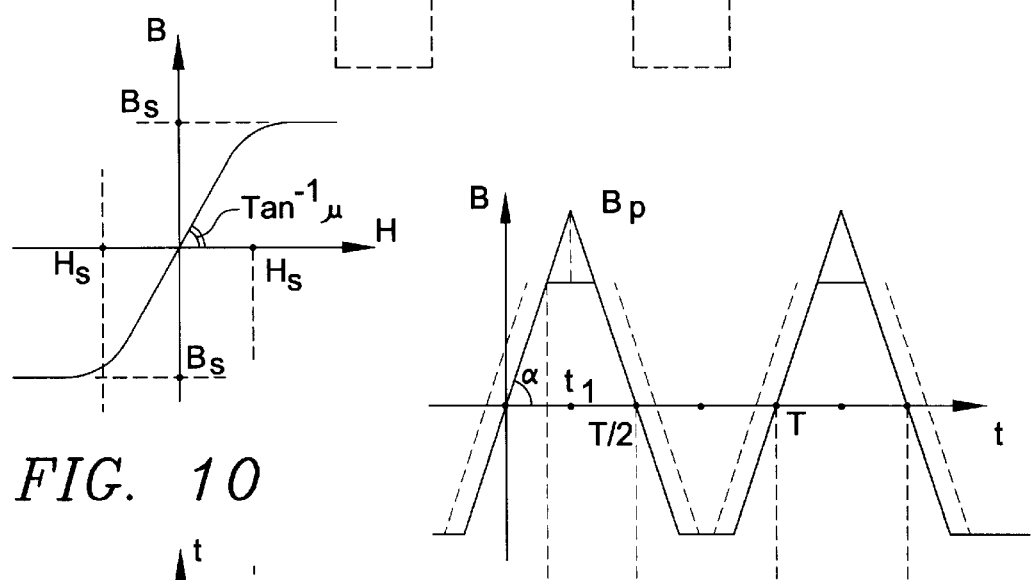
FIG. 10
FIG. 12
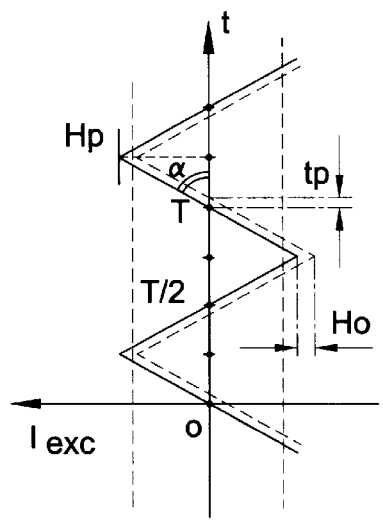
FIG. 11
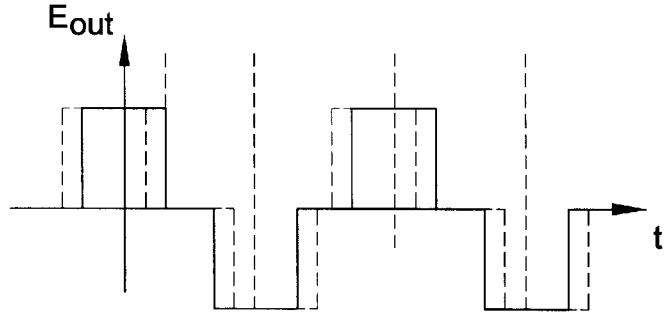
FIG. 13

HYBRID NON-CONTACT CLAMP-ON CURRENT METER

CROSS-REFERENCE TO RELATED APPLICATIONS

This application is a continuation-in-part application of U.S. patent application, Ser. No. 08/399,710, filed March 3, 1995, now U.S. Pat. No. 5,767,667, the disclosure of which is hereby incorporated by reference herein.

BACKGROUND OF THE INVENTION

1. Field of the Invention

This invention relates to a non-contact current meter for sensing electrical currents and, more particularly, to a hybrid non-contact clamp-on current meter utilizing a magnet core wherein the saturation measurement technique is utilized in a DC to low frequency mode and a current transformer technique is utilized when in a high frequency mode.

2. Description of the Background Art

Many types of magnetic core electric current measurement meters utilizing the saturation technique are known and are in wide use today throughout the electrical industry. However, none of the present current meters provide high accuracy measurements for DC to low frequency currents as well as provide the capability to accurately measure high frequency currents.

In general, non-contact clamp-on current meters provide a convenient means for measuring DC to low frequency or high frequency line currents in a current carrying conductor without a need to interrupt the circuit to insert the measuring device. The prior art non-contact clamp-on current meters are generally provided with a magnetic core that surrounds the conductor. The magnetic core is typically comprised of several sections that are pieced together so that the current carrying conductor can be measured. By the magnetic core encircling the current carrying conductor, a single turn winding has, in effect, been established on the magnetic core.

Generally, the non-contact current meters for measuring DC to low frequency currents utilize the hysteresis characteristic of a magnetic core to measure the line current in the current carrying conductor. In effect, the line current to be measured in the current carrying conductor acts to magnetically adjust the magnetic core by way of coupling the magnetic field generated by the line current. The magnetic core generally includes sensing windings positioned thereon of which carry an excitation current of a general fundamental frequency. This excitation current of fundamental frequency is generally used to saturate the magnetic core prior to the introduction of a line current to be measured. The magnetic fields associated with the excitation current are, hence, coupled to the magnetic core wherein a magnetic flux is produced therein and caused to flow. The magnetic flux then induces an AC output voltage on the output terminals of which is a second order or higher even harmonic of the fundamental frequency. When no line current is flowing in the current carrying conductor the AC output voltage detected on the output terminals is zero. Upon the introduction of a line current in the current carrying conductor, the AC output voltage changes and the detected value is proportional to the amplitude and polarity of the line current being measured.

Due to the nature of the saturation technique used for measuring DC to low frequency currents, it follows that the accuracy of the line current measurements greatly depends upon the type of material used, the shape, and the particular construction of the magnetic core. The shape of the magnetic core and the continuity existing in the path of which the magnetic flux flows within the magnetic core greatly affects the efficiency of the magnetic core.

In the magnetic cores utilized in the prior art, the magnetic flux paths are formed from individual sections that are pieced together, having many discontinuities therein. These discontinuities in the flow path of the magnetic flux resultingly magnify the problems with zero errors in the measurements. In essence, any discontinuities in the saturating path of the magnetic core will act as a gap and, therefore, require more drive signal to achieve magnetic core saturation. Additionally, the shape of the prior art magnetic cores often served not to achieve maximum saturation. Representative current meters are disclosed in U.S. Pat. Nos. 3,323,056, 3,490,042, 4,118,597, 4,243,931, 4,266,190, 4,274,051, 4,274,052, 4,278,939, 4,286,211, 4,309,655, 4,362,990, 4,482,862, 4,529,931, 4,914,381, 4,914,383, 5,008,612, and 5,307,008, the disclosures of which are hereby incorporated by reference herein.

Typical examples of non-contact clamp-on type magnetic cores that have been used in the prior art are seen in Bergh, U.S. Pat. No. 3,007,106, and Harnden, U.S. Pat. No. 4,471,300. In the Bergh patent, the magnetic core is comprised of many pieced together portions that essentially introduce many discontinuities in the magnetic core as well as provide a non-ideal magnetic flux path. The magnetic core taught in the Bergh patent is of a general square shape that limits the amount of flux saturation that can be achieved and, thus, requires more power to saturate the magnetic core and is significantly less accurate than the present invention.

In the Harnden patent, the magnetic core is comprised generally of a circular toroidal loop having a hinge in one section and a pin and groove type of securing means in an opposite section of the magnetic core. This particular magnetic core, as taught by Harnden, operates as a current transformer in principle and does not utilize a saturation technique for measurements. Additionally, the Harnden patent is limited in that it is incapable of measuring Direct Current. Further, due to the construction of the Harnden magnetic core, the accuracy achievable from the Harnden current meter is inferior to the present invention.

In addition, generally, the prior art magnetic cores, as utilized currently in the industry, are expensive to manufacture and require the assembling of various portions. Moreover, the magnetic cores currently being used have inherent aspects that contribute to significant inaccuracies in current measurements. Moreover, none of the prior art current meters can mesure both DC to low frequency currents as well as high frequency currents that extend well into the MHZ range with resultingly high accuracy, the range being limited only by the core material.

Therefore, it is an object of this invention to provide improvements to overcome the aforementioned inadequacies of the prior art magnetic cores and provide an improvement which is a significant contribution to the advancement of the current sensing art.

Another object of this invention is to provide a hybrid non-contact clamp-on current meter which utilizes a magnetic core constructed from only two conventional toroidal cores.

Another object of this invention is to provide a hybrid non-contact clamp-on current meter which is comprised of two toroidal cores that are void of discontinuities within the flow path of the magnetic flux so as to minimize inaccuracies in line current measurements and provide a low power requirement during operation in the DC to low frequency mode of operation utilizing the saturation technique.

Another object of this invention is to provide a hybrid non-contact clamp-on current meter of which two toroidal cores are utilized having a circular shape so that a more thorough and optimum flux saturation is achieved therein thereby reducing the problems associated with zero errors when operating in the DC to low frequency mode utilizing the saturation technique.

Another object of this invention is to provide a hybrid non-contact clamp-on current meter which switches to a current transformer mode of operation when sensing a high frequency current.

Another object of this invention is to provide a hybrid non-contact clamp-on current meter which utilizes a first and second set of windings electrically coupled in a bridge configuration as positioned on the magnetic core in both of the DC to low frequency and high frequency operating modes.

Another object of this invention is to provide a hybrid non-contact clamp-on current meter that includes a switching means for changing the operating mode of the current meter according to whether a DC/low frequency signal is being measured or whether a high frequency signal is being measured.

Another object of this invention is to provide a hybrid non-contact clamp-on current meter whereby the magnetic core utilized is easy and inexpensive to manufacture in that it can be cut from a conventional toroidal ferrite core and that no piece assembly is necessary.

Another object of this invention is to provide a current meter for measuring the flow of line current through a current carrying conductor, the current meter comprising in combination: a magnetic core means for electrically coupling and sensing the line current flowing through the current carrying conductor; a first set of windings positioned on the magnetic core means; a second set of windings positioned on the magnetic core means, the second set of windings being electrically coupled to the first set of windings, the first and second sets of windings further including a pair of input and output terminals; a drive means for providing an excitation current to the first and second sets of windings, the drive means being electrically coupled to the pairs of input and output terminals; and a switching means for changing the mode of operation of the current meter from low frequency measurement mode to high frequency measurement mode, the switching means being electrically coupled to the drive means and the output terminals.

The foregoing has outlined some of the pertinent objects of the invention. These objects should be construed to be merely illustrative of some of the more prominent features and applications of the intended invention. Many other beneficial results can be obtained by applying the disclosed invention in a different manner or modifying the invention within the scope of the disclosure. Accordingly, other objects and a more comprehensive understanding of the invention may be obtained by referring to the summary of the invention, and the detailed description of the preferred embodiment in addition to the scope of the invention defined by the claims taken in conjunction with the accompanying drawings.

SUMMARY OF THE INVENTION

For the purpose of summarizing this invention, this invention comprises a hybrid non-contact clamp-on current meter of which the design thereof obviates the inaccuracies and frequency range limitations inherent with the prior art current meters and their associated techniques of measurement.

More particularly, the hybrid non-contact clamp-on current meter utilizes a magnetic core which is comprised two integral toroidal sections of which are free from any discontinuities that would introduce inaccuracies in line current measurements and require higher power for operation. The continuous nature of the magnetic core significantly improves accuracy and sensitivity when the current meter is operating in the DC to low frequency mode utilizing the saturation technique. Due to the present invention requiring low power for operation, the magnetic core can be used in battery powered hand held current meters. Further, the two integral toroidal sections are shaped in a circular manner so as to promote a more thorough flux saturation therein thereby reducing zero errors that are common in the prior art magnetic cores. The integral toroidal sections of the present invention are composed of a ferrite material and are cut in a similar manner as a conventional toroidal ferrite core.

The magnetic core utilized in the present invention also serves similarly when the current meter is operating in the high frequency mode wherein it performs as a current transformer.

The magnetic core of the invention is comprised generally of a first portion and a second portion of which are mounted together via a first pair of opposing side walls positioned on the first portion of the magnetic core and a second pair of opposing side walls positioned on the second portion of the magnetic core. The first pair of opposing side walls positioned on the first portion includes a first and second cut portion therebetween. The second pair of opposing side walls positioned on the second portion includes a third and fourth cut portion therebetween.

Upon coupling the first portion to the second portion of the magnetic core, the first and second cut portions of the first portion are placed in alignment with the third and fourth cut portions of the second portion respectively. The first, second, third and fourth cut portions, thereby forming an aperture of which the current carrying conductor is placed through when a line current measurement is desired.

A first set of windings are positioned on the first integral toroidal section of the first portion and a second set of windings are positioned on the second integral toroidal section of the second portion whereby the flow of the magnetic flux generated by the excitation current in the respective first and second integral toroidal sections are in opposite directions. The first and second sets of windings comprise the sensing windings of the magnetic core of which sense the changes in magnetic flux caused by the line current in the current carrying conductor. The sensing windings then provide an AC output voltage at output terminals that is proportional to the measured line current in the current carrying conductor.

Additionally, the present invention is also directed to a hybrid non-contact clamp-on current meter utilizing the magnetic core and windings configuration described above in a hybrid circuit design wherein two different modes of operation are used. The mode of operation used depends upon the frequency of the line current being measured in the current carrying conductor. The hybrid circuit is comprised of a magnetic core and a first and second set of windings positioned thereon as described above. Electrically coupled to the input terminals of the magnetic core and associated sets of windings is a drive circuit which provides an excitation current to the windings so as to saturate the magnetic core prior to the sensing of low frequency to DC line currents.

Associated with the drive circuit is a detector circuit electrically coupled to the output terminals of the windings on the magnetic core. The detector circuit detects the voltage difference presented at the output terminals which is proportional in amplitude and polarity to the sensed line current. The detected voltage difference is then amplified to a stronger signal level by a DC to low frequency amplifier then transmitted through a unity gain buffer amplifier to the output of the current meter.

Alternatively, when measuring a high frequency current, the output signal from the magnetic core is diverted by way of a first switch away from the detector circuit. The switching is activated by way of a frequency counter which tracks the frequency of the output signal and sends a representative signal to a switch control circuit that, in turn, sends a signal to first and second switches thereby activating them and causing them to toggle to a second position. Thus, the output signal of the magnetic core is directed across a load resistor and to a high frequency amplifier. The output of the high frequency amplifier is then directed through the second switch to the unity gain buffer amplifier to the output of the current meter. Hence, the first and second switches serve to by-pass the detector circuit and low frequency amplifier.

Further, the switch control circuit also sends a signal to a disable circuit upon the sensing of a high frequency current by the frequency counter that, in turn, sends a signal to the drive circuit thereby turning off the excitation current that was being applied to the input terminals during the operation in the low frequency mode.

An important feature of the present invention is that the complete magnetic core construction utilized in the hybrid non-contact clamp-on current meter is comprised of only two magnetic core pieces such that the magnetic core is easy to manufacture and assemble.

Another important feature of the present invention is that the configuration of the first and second integral toroidal sections, of each respective first and second portion, functions to provide a magnetic flux path free of discontinuities of which promotes a more thorough flux saturation of the magnetic core and provides for a low power requirement for operation. Thus, the line current measurements achieved by the magnetic core of the present invention are more accurate and less susceptible to zero errors.

Another important feature of the present invention is that the hybrid non-contact clamp-on current meter utilizes a magnetic core which has an aperture that readily receives current carrying conductors of various sizes. The aperture, being formed by the respective cut portions of the first and second portions of the magnetic core, is positioned so as to place the current carrying conductor in close proximity with the first and second integral toroidal sections thereby creating a thorough flux saturation in the magnetic core. Due to the thorough flux saturation, the hybrid non-contact clamp-on current meter is more sensitive and, therefore, can provide more accurate and exact measurements.

Another important feature of the present invention is that the hybrid non-contact clamp-on current meter utilizes the magnetic core and windings configuration in a hybrid circuit such that both DC to low frequency current signals can be measured as well as high frequency AC currents. Thus, the same current meter can measure currents from DC to well into Megahertz range in frequency.

Another important feature of the present invention is that the hybrid non-contact clamp-on current meter automatically switches operating modes depending upon the frequency of the line current being measured. The operating modes being of saturation technique for DC to low frequency currents and of a current transformer for high frequency currents.

Another important feature of the present invention is that the hybrid non-contact clamp-on current meter utilizes a first and second set of windings coupled in a "bridge" configuration that is utilized in both operating modes.

The foregoing has outlined rather broadly the more pertinent and important features of the present invention. The detailed description of the present invention that follows is offered so that the present contribution to the art may be more fully appreciated. Additional features of the invention will be described hereinafter. These form the subject of the claims of the invention. It should be appreciated by those skilled in the art that the conception and the disclosed specific embodiment may be readily utilized as a basis for modifying or designing other methods and structures for carrying out the same purposes of the present invention. It should also be realized by those skilled in the art that such equivalent methods and structures do not depart from the spirit and scope of the invention as set forth in the appended claims.

BRIEF DESCRIPTION OF THE DRAWINGS

For a fuller understanding of the nature and objects of the invention, reference should be had to the following detailed description taken in connection with the accompanying drawings in which:

FIGS. 1a, 1b, 1c and 1d are illustrations of prior art magnetic cores utilized in current meters having many discontinuities within the flux path as well as non-circular shapes which detract from the amount of flux saturation that is achievable in the magnetic core;

FIG. 6 is an isometric view of the magnetic core of the hybrid non-contact clamp-on current meter in a closed state illustrating the alignment of the first and second pairs of opposing side walls, the relative positioning of the first integral toroidal section to the second integral toroidal section, and the aperture thereby formed by the cut portions of each first and second portion within which the current carrying conductor passes through;

FIGS. 9, 10, 11, 12, 13, 14, 15, and 16 are graphical illustrations of the various waveforms associated with the behavior of the magnetic core for the hybrid non-contact clamp-on current meter operating in the low frequency mode of which will aid in the explanation thereof;

Similarly referenced numerals refer to similar parts throughout the several figures.

DETAILED DESCRIPTION OF THE PREFERRED EMBODIMENT

Figure 2:
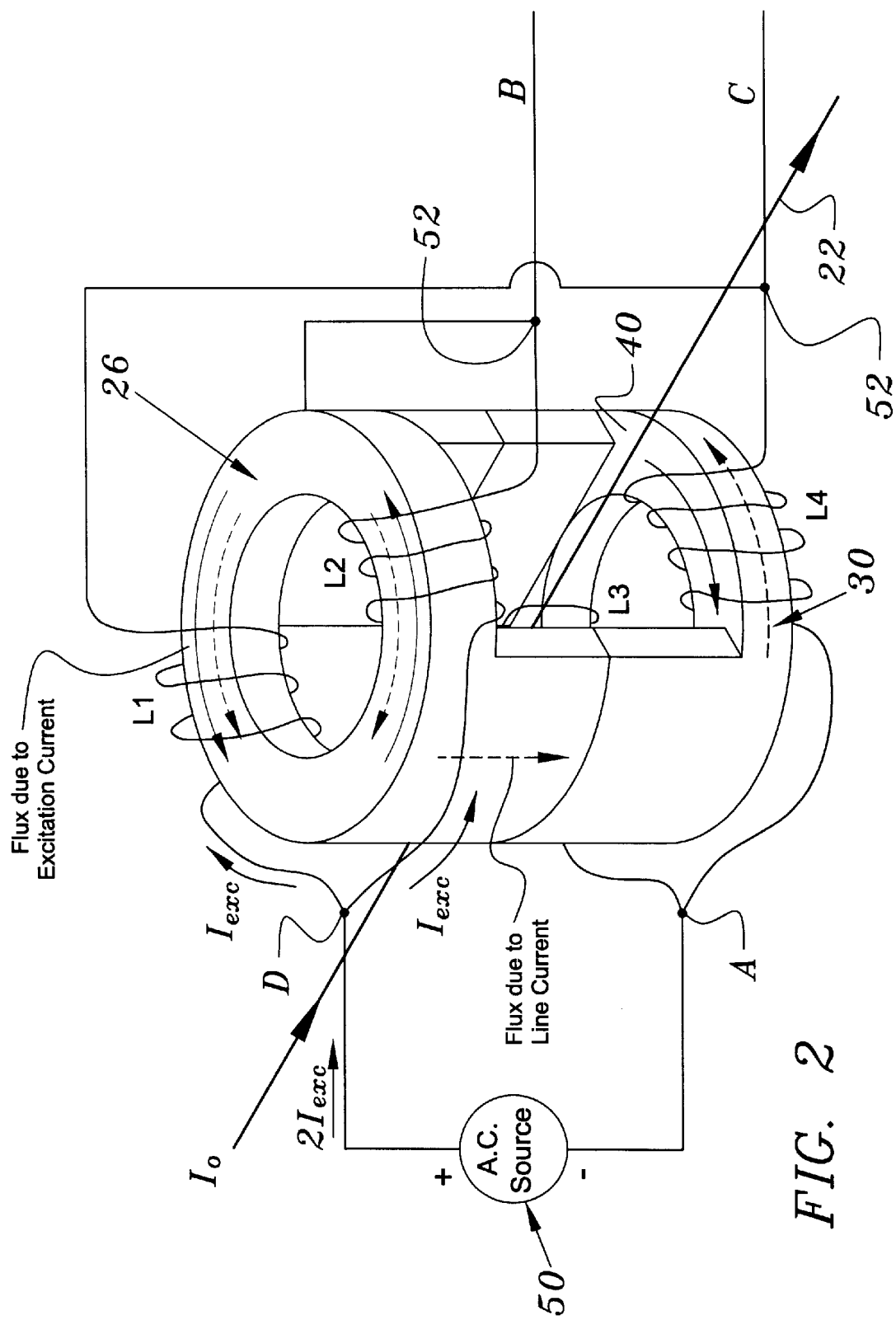
FIG. 2 is a simplified isometric view of the hybrid non-contact clamp-on current meter, utilizing the magnetic core of the present invention, illustrating the relative positioning of the first and second sets of windings on the first and second integral toroidal sections which are electrically coupled to form a bridge circuit as used in the low frequency saturation mode.

In referring to FIGS. 1a, 1b, 1c, and 1d, various magnetic cores 15 are illustrated that have been used in the prior art. It can be seen in FIGS. 1a, 1b, and 1c that many prior art magnetic cores 15 are of a square shape and contain many sections that are coupled together to form the complete magnetic cores 15. In these prior art magnetic cores 15 there are many discontinuities within the magnetic flux path of which will limit the accuracy of measurements and limit the sensitivity of the current meter. In addition, the presence of the discontinuities in the flux path causes more power to be required for saturation of the magnetic cores 15 to occur.

In FIG. 1d, another prior art magnetic core 16 is shown having a circular shape, a hinged section 17, and a notch and groove section 18. This circular shaped magnetic core 16 can open and close to facilitate the placement of a current carrying conductor 22 therethrough. However, the circular shaped magnetic core 16 of the prior art device shown in FIG. 1d operates as a current transformer in principle and is incapable of measuring direct current. Additionally, the magnetic core 16 contains discontinuities within the magnetic flux path which results in more power being required in order to saturate the magnetic core 16.

Now, in referring to FIG. 2, the magnetic core 20 for the hybrid non-contact clamp-on current meter is illustrated in its assembled state showing a current carrying conductor 22 passing therethrough in position to be measured. The magnetic core 20 is illustrated in FIG. 2 as when operating in the low frequency mode utilizing the saturation technique to measure the line current in the current carrying conductor 22. The magnetic core 20 for the hybrid non-contact clamp-on current meter comprises a first portion 24 having a first integral toroidal section 26 and a second portion 28 having a second integral toroidal section 30. The first integral toroidal section 26 includes a first internal side 32 and a first pair of opposing integral side walls 34 that extend from the first internal side 32. A first and second cut portion 36 and 38 respectively, is interposed between the first pair of opposing integral side walls 34. The second integral toroidal section 30 includes a second internal side 40 of which a second pair of opposing integral side walls 42 extends therefrom. A third and fourth cut portion 44 and 46 respectively, is interposed between the second pair of opposing integral side walls 42.

Figure 3:
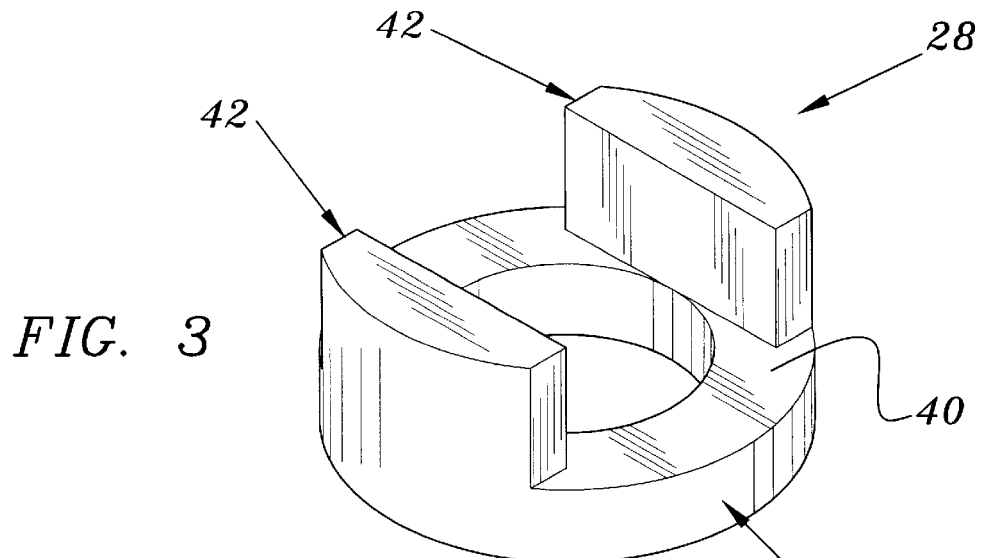
FIG. 3 is an isometric view illustrating the second portion of the magnetic core of the present invention where the second integral toroidal section and the second pair of opposing side walls that extend from the second integral toroidal section are shown in their relative positions.

In referring to FIG. 3, the second pair of opposing integral side walls 42 can be seen extending from the second internal side 40 of the second integral toroidal section 30. The second pair of opposing integral side walls 42 are conformal with the outer circular shape of the second integral toroidal section 30.

Figure 4A:
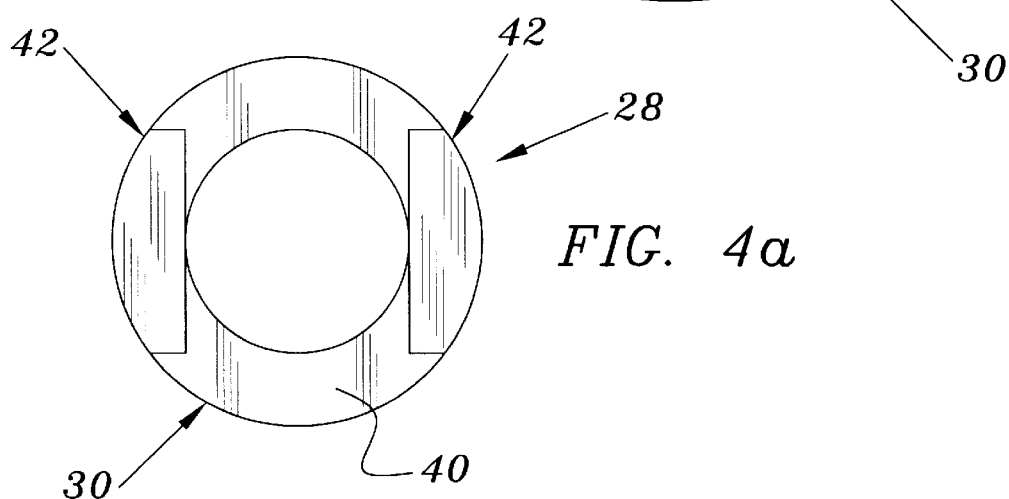
FIG. 4a is a top view of the second portion of the magnetic core illustrating the relative position of the second pair of opposing side walls and the second integral toroidal section.
Figures 4B, 4C:
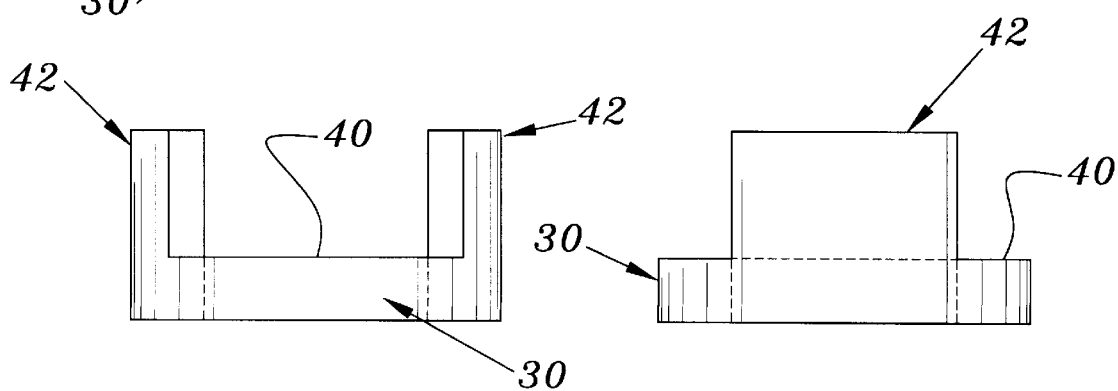
FIG. 4b is a front view of the second portion of the magnetic core illustrating the relative positioning of the second pair of opposing side walls and the second integral toroidal section.
FIG. 4c is a side view illustrating the relative positioning of the second pair of opposing side walls and the second integral toroidal section.

In referring to FIGS. 4a, 4b, and 4c, the second portion 28 of the magnetic core 20 is shown in various views so as to better illustrate the second pair of opposing integral side walls 42. FIG. 4a is a top view of the second portion 28 of the magnetic core 20 which shows the relative positioning of the second pair of integral opposing side walls 42 on the second internal side 40 of the second integral toroidal section 30. In referring to FIGS. 4b and 4c, the second pair of opposing integral side walls 42 are illustrated in relation to the second integral toroidal section 30 as well as illustrating the third and fourth cut portions 44 and 46 thereof. The first portion 24 of the magnetic core 20 includes similar aspects as in the second portion 28. Essentially, the first portion 24 and the second portion 28 are identically the same in structure.

Figure 5:
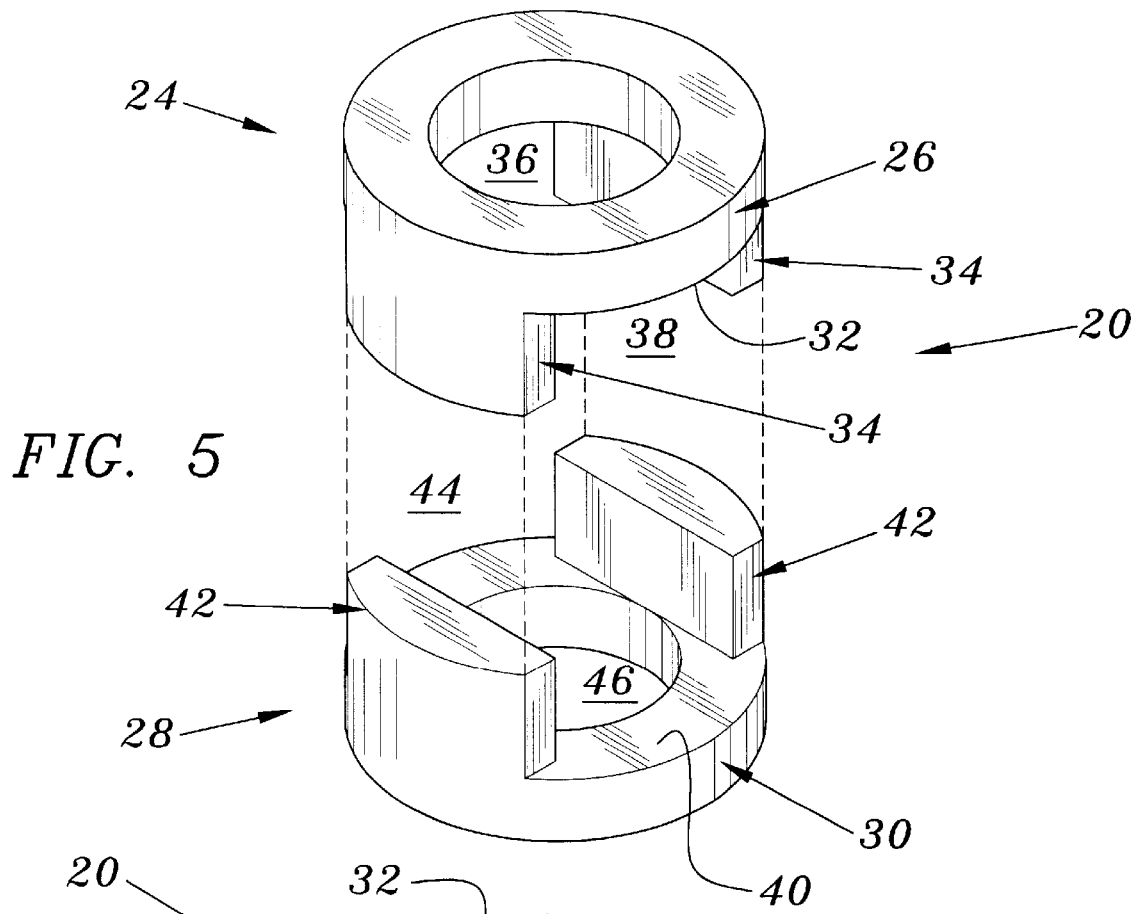
FIG. 5 is an isometric view of the first portion and second portion of the magnetic core for the hybrid non-contact clamp-on current meter illustrating the relative alignment of the first and second pairs of opposing side walls.

In now referring to FIG. 5, the magnetic core 20 comprised of the first portion 24 and the second portion 28 can be seen in relative position to each other while in the open state such that a current carrying conductor 22 could be readily placed in position to be measured.

Figure 6:
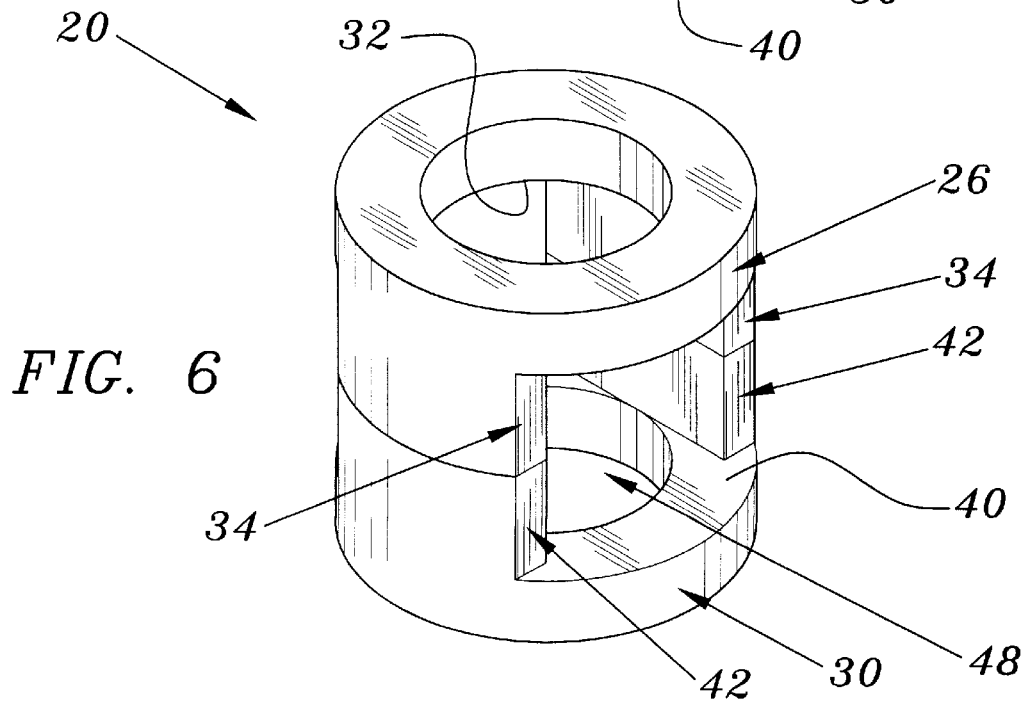

In referring to FIG. 6, the magnetic core 20, comprised of the first portion 24 and the second portion 28, can be seen in its closed state. While in its closed state, an aperture 48 is formed due to the alignment of the first, second, third, and fourth cut portions 36, 38, 44 and 46. The current carrying conductor 22 is placed within the defined aperture 48 in order for a line current measurement to be performed.

In referring back to FIG. 2, the magnetic core 20 for the hybrid non-contact clamp-on current meter is shown illustrating the complete assembly. A first set of windings L1 and L2 are coupled to the first integral toroidal section 26 at the first and second cut portions 36 and 38, respectively. A second set of windings L3 and L4 are coupled to the second integral toroidal section 30 at the third and fourth cut portions 44 and 46 respectively. An excitation current source 50 is electrically connected to the first and second sets of windings L1 and L2, L3 and L4, so as to provide an excitation current thereto to produce an initial magnetic charging of the first and second integral toroidal sections 26 and 30 when the hybrid non-contact clamp-on current meter is operating in the low frequency mode. The excitation current source 50 is also referred to herein as the drive circuit 50.

Figure 8:
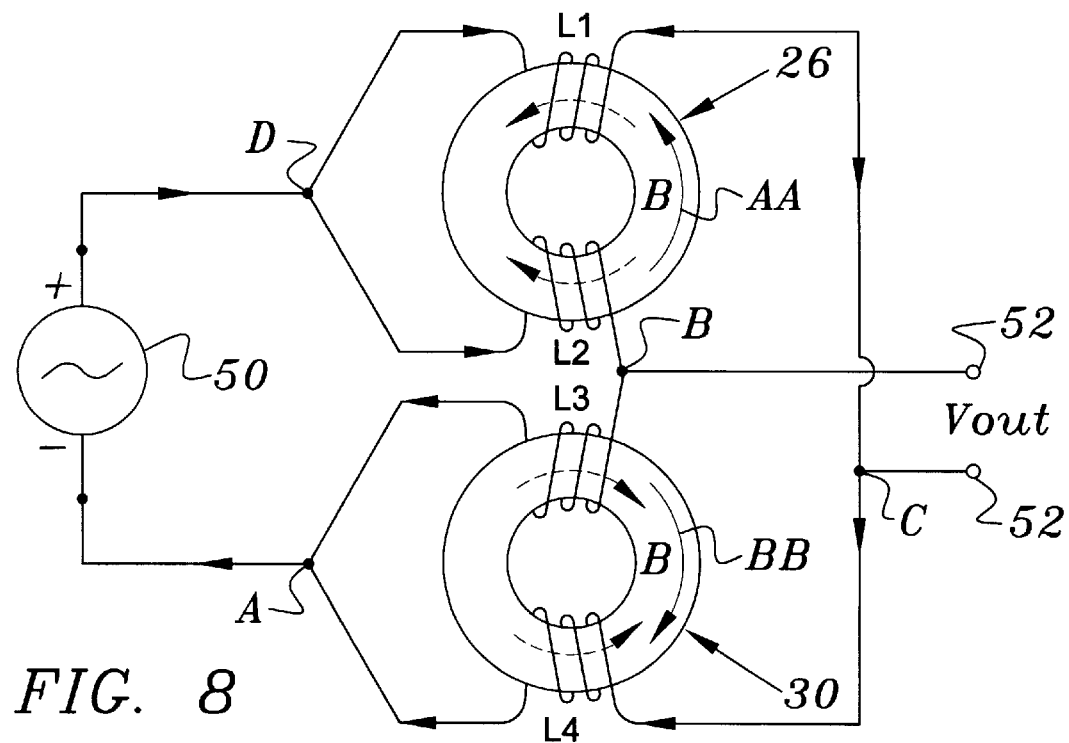
FIG. 8 is an electrical schematic of the circuit formed from the first and second set of windings being electrically coupled to the first and second integral toroidal sections of the magnetic core for the hybrid non-contact clamp-on current meter as utilized in the low frequency mode.
Figure 14:
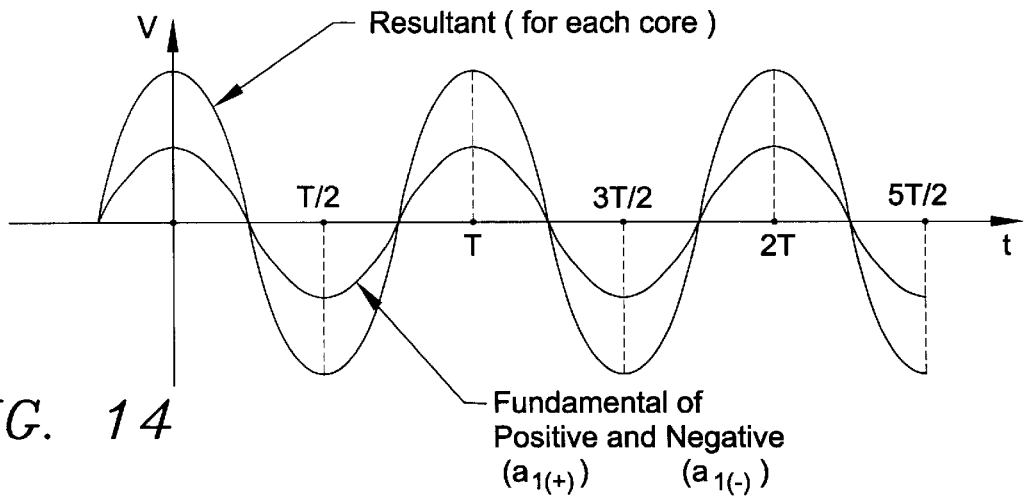
Figure 15:
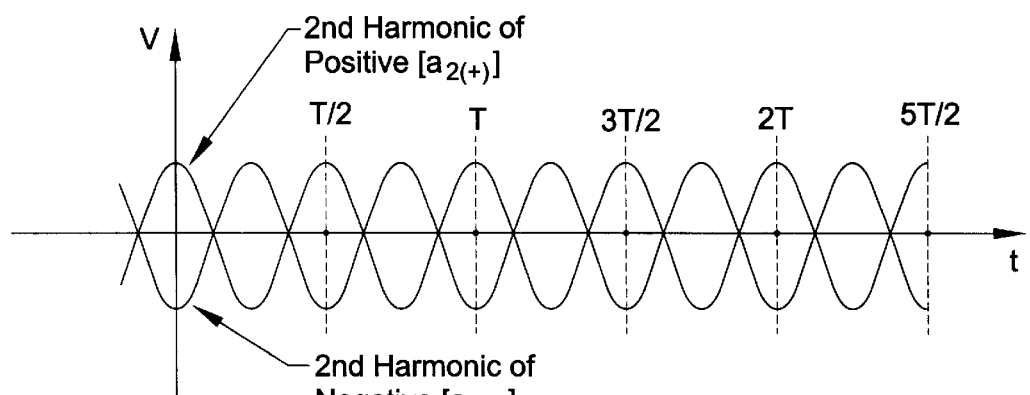
Figure 16:
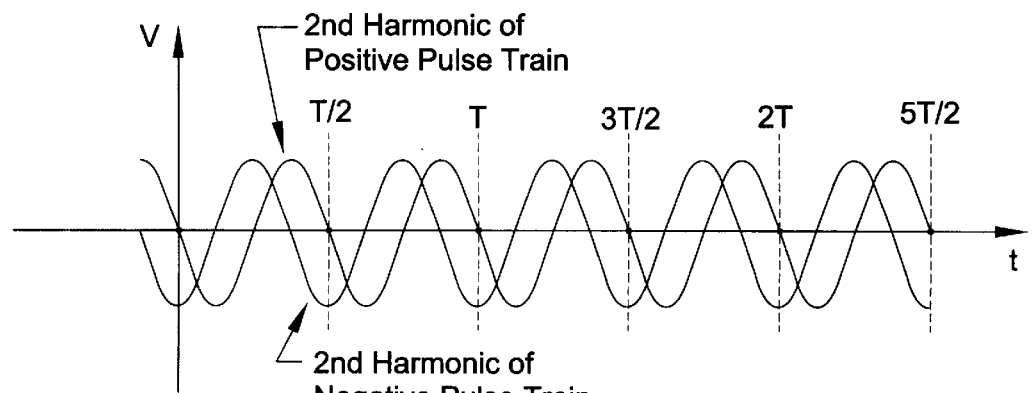
Figure 17:
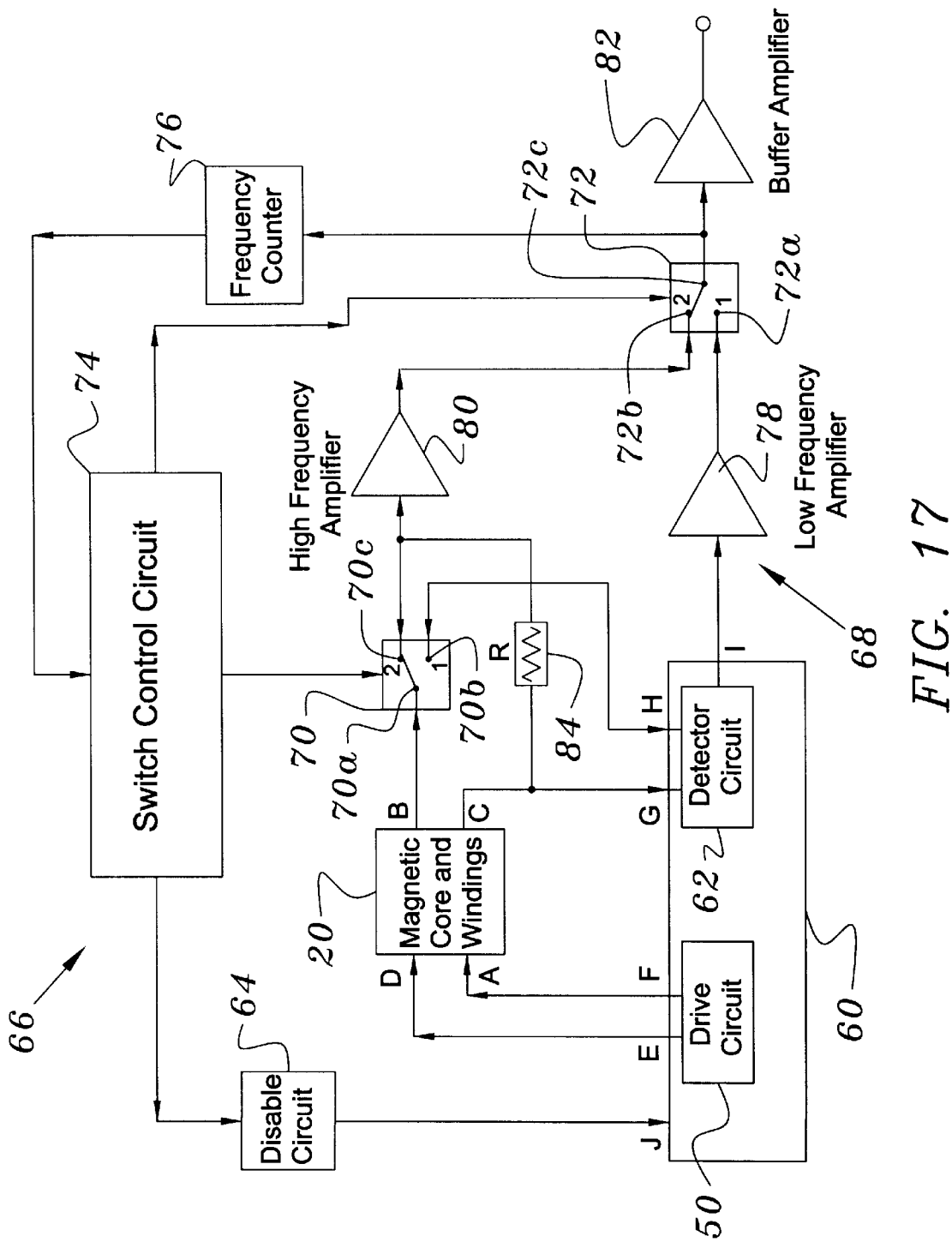
FIG. 17 is a block diagram of the hybrid non-contact clamp-on current meter illustrating the electronic configuration of the magnetic core relative to the drive circuit, the switch control circuit, the first and second switches, the disable circuit, the frequency counter, the high frequency amplifier, the low frequency amplifier and the buffer amplifier.

In referring to FIG. 8, an electrical schematic of the magnetic core 20 for the hybrid non-contact clamp-on current meter is illustrated showing the various electrical connections which form the first and second sets of windings L1 and L2, L3 and L4, into a circuit. The first set of windings L1 and L2 are electrically connected in parallel. Of the second set of windings L3 and L4, L3 is electrically connected in series with L2, and L4 is electrically connected in series with L1. A pair of output terminals 52 are positioned between the series connected L2 and L3 windings and between the series connected L1 and L4 windings. The output terminals 52 are to facilitate the measurement of an output voltage level that is produced by the first and second integral toroidal sections 26 and 30. The output terminals 52, also indicated by the letters B and C, are further electrically connected to additional electronic circuitry as indicated in FIG. 17 which is discussed later in more detail.

Upon operation in the low frequency mode, an excitation current of positive pulses is electrically applied to the windings L1 and L2, L3 and L4. The excitation current flows through the first set of windings L1 and L2 and the second set of windings L3 and L4 to set up a magnetic charge within the first and second integral toroidal sections 26 and 30. As the excitation current flows through the windings L1 and L2, L3 and L4, the magnetic field associated with the excitation current is coupled to the first and second integral toroidal sections 26 and 30. The magnetic field is retained in the first and second integral toroidal sections 26 and 30 in the form of magnetic flux which flows in the circular path shaped by the first and second integral toroidal sections 26 and 30, respectively.

Figure 7:
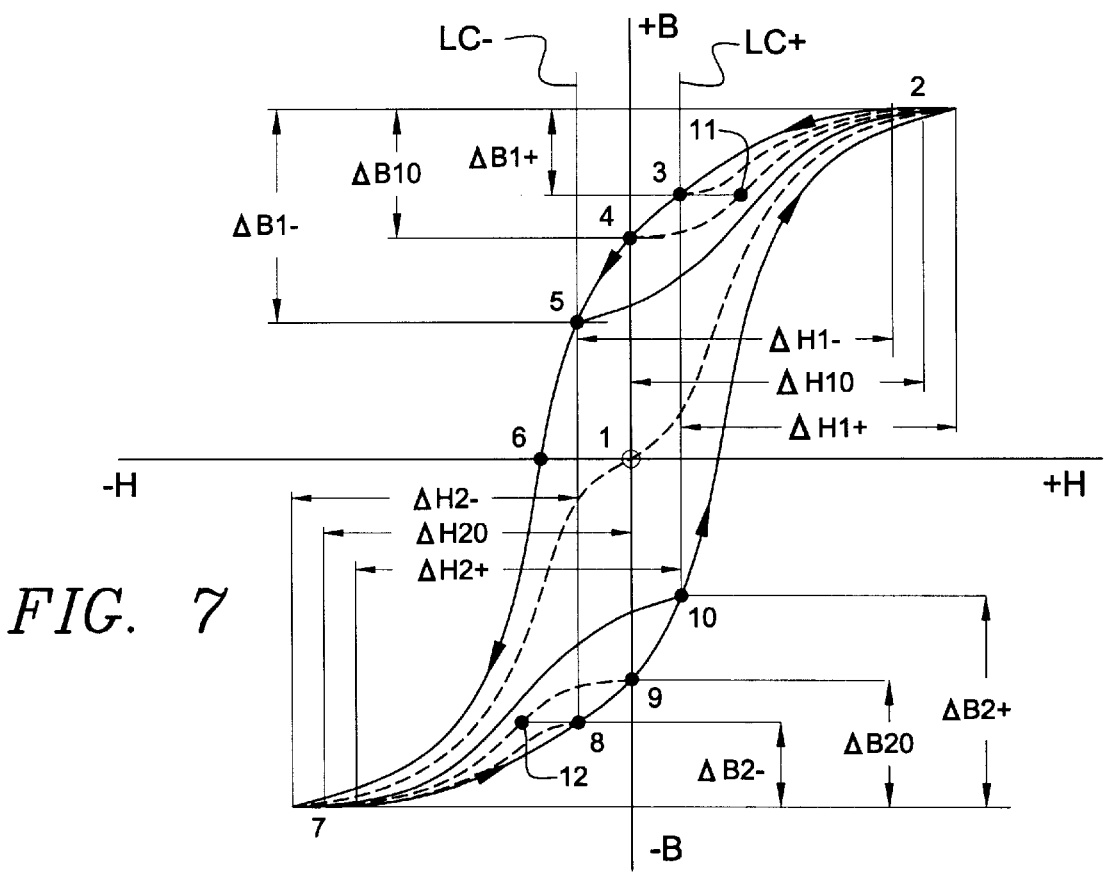
FIG. 7 is a representation of the static hysteresis characteristics of the first and second integral toroidal sections with various markings to aid in the explanation of the dynamic functioning thereof when the hybrid non-contact clamp-on current meter is operating in the low frequency mode utilizing the saturation technique.

In referring to FIG. 7, the interrelation of the magnetic field being coupled to the first and second integral toroidal sections 26 and 30 and the magnetic flux flowing within the first and second integral toroidal sections 26 and 30 may be better understood. FIG. 7 shows the major saturation hysteresis characteristic along the line 2, 3, 4, 5, 6, 7, 8, 9, 10, and 2 of the magnetic core 20. As is well known in the art, the major saturation hysteresis characteristics may also be referred to as the major saturation hysteresis curve, or loop. The upper half of FIG. 7 is useful in understanding what likely happens in the first integral toroidal section 26; and, the lower half of FIG. 7 is useful in understanding what likely happens in the second integral toroidal section 30 since the excitation current pulses in the first and second integral toroidal sections 26 and 30 are of opposite effect.

Upon applying an excitation current having a positive unipolar pulse, the magnetic core 20 will behave in a manner as represented along the line from pt. 1 to 2 on the graph in FIG. 7. Upon removing the excitation current from the first and second sets of windings L1 and L2, L3 and L4 thereby bringing the magnetic field intensity H down to zero, the first integral toroidal section 26 will behave in a manner that is represented along the lines 2 to 3 to 4. The leftover magnetic flux density B which is represented at pt. 4 on the graph is known as the residual magnetism. The second integral toroidal section 30 will behave in a similar manner except that, since the second set of windings, L3 and L4, produce a magnetic flux flowing in an opposite direction to that of which the magnetic flux is flowing in the first integral toroidal section 26, the second integral toroidal section 30 will obtain a negative saturation point, pt. 7 in FIG. 7. Upon the removal of the excitation current from the first and second sets of windings L1 and L2, L3 and L4 the second integral toroidal section 30 will behave in a manner along the line from pt. 7 to 8 to 9.

If the excitation current is then applied again, representing a positive H-field intensity, the first integral toroidal section 26 will behave in a manner represented along the line from pt. 4 to 11 to 2. The second integral toroidal section 30 will behave in a similar manner as the first integral toroidal section 26 in that it will behave in a manner as represented along the line from 9 to 12 to 7. Due to the inherent aspect of the magnetic core 20 to retain a residual magnetism once the initial magnetic field intensity H is removed, a negative magnetic field intensity H would be required in the first integral toroidal section 26 to bring the magnetic flux density B to zero as indicated at pt. 6. Thus, each curve represented by 4 to 11 to 2 to 3 to 4 and 9 to 12 to 7 to 8 to 9 will be repeated for every cycle of an excitation current pulse in the respective first and second integral toroidal sections 26 and 30.

In further referring to FIG. 7, $\Delta H10$ represents the change in magnetic field intensity H in the first integral toroidal section 26 and $\Delta H20$ represents the change in magnetic field intensity H in the second integral toroidal section 30 when the excitation current is flowing and the respective first and second integral toroidal sections 26 and 30 are in a saturated state. When no line current is flowing in the current carrying conductor 22, the change in magnetic field intensities $\Delta H10$ and $\Delta H20$ are of equal and opposite polarities. In a similar fashion, when the excitation current is applied, the change in magnetic flux density B is represented by $\Delta B10$ in the first integral toroidal section 26 and $\Delta B20$ in the second integral toroidal section 30. The change in the magnetic flux densities $\Delta B10$ and $\Delta B20$ are of equal amounts and of opposite polarity. The change in magnetic flux density B of the respective first and second integral toroidal sections 26 and 30 are then subtracted at the output terminals 52 to determine a voltage difference. A zero voltage results at the output terminals 52 when no line current is flowing through the current carrying conductor 22.

Upon the introduction of a line current flowing in the current carrying conductor 22, the magnetic field intensity H and the magnetic flux density B in the respective first and second integral toroidal sections 26 and 30 will change. The first integral toroidal section 26 would behave in a manner as represented along the lines 3 to 2 to 3 when a positive polarity line current is flowing through the current carrying conductor 22. The second integral toroidal section 30 would behave in a manner as illustrated along lines 10 to 7 to 8 to 9 to 10 due to the same positive polarity line current flowing in the current carrying conductor 22. Thus, pt. 3 would represent the settling point in the first integral toroidal section 26 corresponding to when the excitation current in the windings L1 and L2, L3 and L4 is zero during the time between each individual excitation pulse. Similarly, pt. 10 would represent the settling point in the second integral toroidal section 30 when the excitation current flowing through the windings L1 and L2, L3 and L4 is zero between each individual excitation pulse.

In this situation, with a positive polarity line current, $\Delta H1+$ would represent the change in the magnetic field intensity H in the first integral toroidal section 26 and $\Delta H2+$ would represent the change in the magnetic field intensity H in the second integral toroidal section 30. Similarly, the magnetic flux density B would also experience changes due to the line current of positive polarity flowing through the current carrying conductor 22. In the first integral toroidal section 26, $\Delta B1+$ would represent the change in the magnetic flux density B caused by the positive flowing line current and $\Delta B2+$ would represent the change in the magnetic flux density B in the second integral toroidal section 30.

It can now be seen that the $\Delta B1+$ change in the magnetic flux density B in the first integral toroidal section 26 is of a different amount than the ΔB2+ change in the magnetic flux density B taking place in the second integral toroidal section 30. This overall change in magnetic flux density B in the first and second integral toroidal sections 26 and 30 will manifest itself in an output voltage being detected on the output terminals 52 that corresponds to the difference between the corresponding changes (ΔB1+ and ΔB2+) of magnetic flux density B in the respective first and second integral toroidal sections 26 and 30. This resulting output voltage will be of a second harmonic of the fundamental frequency of the excitation current. Further, the respective output voltage will have a certain amplitude and polarity of which will be proportional to the line current flowing in the current carrying conductor 22. The polarity of the output voltage will dictate which direction the current is flowing in the current carrying conductor 22. The amplitude of the output voltage will dictate the strength of the line current in the current carrying conductor 22.

Similarly, when a negative polarity line current is flowing in the current carrying conductor 22, the first integral toroidal section 26 will experience a magnetic curve corresponding to the line from 5 to 2 to 3 to 4 to 5. When the excitation current flowing in the first and second sets of windings L1 and L2, L3 and L4 is at zero between the individual positive unipolar pulses, pt. 5 will be the settling point of the magnetic flux density B in the first integral toroidal section 26. The corresponding changes in the first integral toroidal section 26 would be represented by ΔH1− for the change in the magnetic field intensity H and ΔB1− for the change in the magnetic flux density B.

The negative polarity pulse line current flowing in the current carrying conductor 22 would simultaneously cause changes to occur in the second integral toroidal section 30 that would be characterized by the magnetic loop following along the lines 8 to 7 to 8. The changes in the magnetic field intensity H in the second integral toroidal section 30 are represented by ΔH2−, and the changes in the magnetic flux density B in the second integral toroidal section 30 are represented by ΔB2−.

In a similar fashion as described previously, the changes in the magnetic flux density B in the respective first and second integral toroidal sections 26 and 30 will be subtracted and the resulting voltage difference will be detected on the voltage output terminals 52. It can be seen that the change in magnetic flux density ΔB2− in the second integral toroidal section 30 is less than the change in magnetic flux density ΔB1− occurring in the first integral toroidal section 26, and therefore, after subtracting the two quantities ((ΔB2−)−(ΔB1−)), the resulting output voltage will be negative, representing a negatively flowing line current. Again, it is noted that the output voltage will be of a second harmonic of the fundamental frequency of the excitation current.

The proportionality of the output voltage to the measured line current in the current carrying conductor 22 can be illustrated further by referring to FIGS. 9–16 in conjunction with the following mathematical relationships:

Referring to FIG. 2, with no line current in the current carrying conductor 22 and the excitation current applied, as in FIG. 11, the induced voltage $E_{CA}$ at winding $L_4$ due to excitation current in $L_3$ will be:

$$E_{CA} = NA \frac{dB}{dt} \times 10^{-8} = NA\mu \times 10^{-8} \frac{dH}{dt}$$

-continued where $E_{CA}$ is the induced voltage at terminals C and A.

$$\frac{dB}{dt} \frac{\mu H_P}{T/4} = 4f\mu H_P \quad \text{(From FIG. 12, for } -t_1 + nT < t < t_1 + nT)$$

$$\frac{dB}{dt} = -\frac{\mu H_P}{\frac{T}{4}} = -4f\mu H_p$$

$$\left(\text{for intervals } \frac{T}{2} - t_1 + nT < t < T/2 + t_1 + nT\right)$$

For pulse width:

$$\text{Tan}\alpha = \frac{B_{sat}}{t_1} = \frac{B_p}{\frac{T}{4}} = 4f\mu H_p; \quad \text{and } t_1 = \frac{B_{sat}}{4f\mu H_p}$$

Then, the pulse width is: $d = 2t_1 = \frac{B_{sat}}{2f\mu H_p}$

Therefore $E_{CA}$ consists of a pulse train with the peak amplitude of $E_p = (NA\mu \times^{-8})(4fH_p)$; which is alternately in negative directions, having a pulse width of $$\frac{B_s}{2f\mu H_p}.$$

The output voltage can be separated into a set of a positive going pulse train and a set of a negative going pulse train.

The Fourier components of a pulse train having a width of "d" and amplitude of $E_{peak}$, ($E_p$), is: (refer to FIG. 9) It then follows that $E_{CA(+)}$ is an even function, therefore there are no sine components in the waveform.

$$E_{CA(+)} = \frac{E_p d}{T} + \frac{2E_p d}{T} \sum_{n=1}^{\infty} \left( \frac{\sin\left(\frac{n\pi d}{T}\right)}{\frac{n\pi d}{T}} \cos(n\omega t) \right)$$

$$\frac{E_p d}{T} = NA\mu \times 10^{-8} \times 4fH_p \times \frac{B_s}{2f\mu H_p} \times f = NA \times 10^{-8} \times 2fB_s$$

Therefore: $a_n = NA \times 10^{-8} \times 4fB_s \times \frac{2\mu H_p}{n\pi B_s} \sin\left(\frac{n\pi B_s}{2\mu H_p}\right) \cos(n\omega t$ $$\frac{n\pi d}{T} = n\pi f \times \frac{B_s}{2f\mu H_p} = \frac{n\pi B_s}{2\mu H_p}$$

The fundamental component is then:

$$a_{1(+)} = NA \times 10^{-8} \times 8f\mu \times \frac{H_p}{\pi B_s} \sin\left(\frac{\pi B_s}{2\mu H_p}\right) \cos(\omega t)$$

and the second harmonic is:

$$a_{2(+)} = NA \times 10^{-8} \times 4f\mu \frac{H_p}{\pi B_s} \sin\left(\frac{\pi B_s}{\mu H_p}\right) \cos(2\omega t)$$

For the negative pulse train, $E_p$ is:

$$E_p = -NA\mu \times 10^{-8} \times 4fH_p; \quad \text{and } t = \tau + \frac{T}{2}$$

Therefore:

$$E_{CA(-)} = -\frac{E_p d}{T} - \frac{2E_p d}{T} \sum_{n=1}^{\infty} \frac{\sin\left(\frac{n\pi d}{T}\right)}{\frac{n\pi d}{T}} \cos\left(n\omega t + n\omega \frac{T}{2}\right)$$

-continued $$E_{CA(-)} = -\frac{E_p d}{T} - \frac{2E_p d}{T}\sum_{n=1}^{\infty}\frac{\sin\left(\frac{n\pi d}{T}\right)}{\frac{n\pi d}{T}}\cos(n\omega t + n\pi)$$

Now, the fundamental component of the negative pulse train $$a_{1(-)} = -NA \times 10^{-8} \times 8f\mu\frac{H_p}{\pi B_s}\sin\left(\frac{\pi B_s}{2\mu H_p}\right)\cos(n\omega t + \pi)$$

or $a_{1(+)} = a_{1(-)}$ and $a_{2(-)} = -NA \times 10^{-8} \times 4f\mu\frac{H_p}{\pi B_s}\sin\left(\frac{\pi B_s}{\mu H_p}\right)\cos(n\omega t + 2\pi)$ or $a_{2(+)} = -a_{2(-)}$ and $a_{o(+)} = a_{o(-)}$ The induced voltage between terminals C and A is then found from:

$$E_{CA}=E_{CA(+)}+E_{CA(-)}$$

where $a_Z=a_Z(+)+a_{Z(-)}=0$; and $a_1=a_{1(+)}+a_{1(-)}=2a_{1(+)}$

Thus, it can be seen that with no line current in the current carrying conductor 22, the components of $E_{CA}$ consist of only the fundamental harmonics which are additive. The second harmonics cancel each other out. In a similar manner, the induced voltage between terminals B and A ($E_{BA}$) can be calculated where:

$$E_{BA}=E_{BA(+)}+E_{BA(-)};\ a_2=a_{2(+)}a_{2(-)}=0;\ a_1=a_{1(+)}+a_{1(-)}=2a_{1(+)};\ \text{and}\ V_{out}=E_{BC}=E_{BA}-E_{CA}=0$$

As can be seen with no aperture current, there will be no voltage present at the output.

Now, in referring to FIG. 2, a magnetizing force $H_o$ will be generated when an aperture current $I_o$ is applied. This magnetizing force $H_o$ will in turn then cause a resulting phase shift between the positive and negative going pulse trains.

From FIG. 11, the phase shift can now be calculated from:

$$\tan\alpha = \frac{H_p}{\frac{T}{4}} = \frac{H_o}{t_p} \Rightarrow t_p = \frac{H_o}{4fH_p}$$

$$\phi_n = n\omega t_p = n2\pi f\frac{H_o}{4fH_p} = \frac{n\pi H_o}{2H_p}$$

$E_{CA(+)}$ and $E_{CA(-)}$ are both even functions:

$$E_{CA} = E_{CA(+)} + E_{CA(-)} =$$

$$\frac{E_p d}{T} + \frac{2E_p d}{T}\sum_{n=1}^{\infty}\frac{\sin\left(\frac{n\pi d}{T}\right)}{\frac{n\pi d}{T}}\cos(n\omega t + \phi_n) -$$

$$\frac{E_p d}{T} - \frac{2E_p d}{T}\sum_{n=1}^{\infty}\frac{\sin\left(\frac{n\pi d}{T}\right)}{\frac{n\pi d}{T}}\cos(n\omega t + n\pi - \phi_n)$$

$$\frac{n\pi d}{T} = \frac{n\pi B_s}{2\mu H_p} \text{ and } \frac{E_p d}{T} = NA \times 10^{-8} \times 2fB_s$$

$$E_{CA} = 4NA \times 10^{-8} \times$$

$$fB_s\sum_{n=1}^{\infty}\frac{\sin\left(\frac{n\pi B_s}{2\mu H_p}\right)}{\frac{n\pi B_s}{2\mu H_p}}[\cos(n\omega t + \phi_n) - \cos(n\omega t + n\pi - \phi_n)]$$

In a similar fashion $E_{BA}$ can be calculated:

$$E_{BA} = E_{BA(+)} + E_{BA(-)}$$

$$E_{BA} = 4NA \times 10^{-8} \times$$

$$fB_s\sum_{n=1}^{\infty}\frac{\sin\left(\frac{n\pi B_s}{2\mu H_p}\right)}{\frac{n\pi B_s}{2\mu H_p}}[\cos(n\omega t + \phi_n) - \cos(n\omega t + n\pi + \phi_n)]$$

Note that in the above equation, the polarity of $\phi_n$ is reversed. This is due to the fact that the magnetic field generated by the line current, in this section of the core, will be additive to the magnetic field generated by the excitation current.

The core output voltage can now be calculated from:

$$V_{out}=E_{BC}=E_{BA}-E_{CA};\ \text{and}$$

$$E_{BA} - E_{CA} = 4NA \times 10^{-8} \times fB_s\sum_{n=1}^{\infty}\frac{\sin\left(\frac{n\pi B_s}{2\mu H_p}\right)}{\frac{n\pi B_s}{2\mu H_p}} \times$$

$$[(\cos(n\omega t - \phi_n) - \cos(n\omega t + n\pi + \phi_n)) - (\cos(n\omega t + \phi_n) - \cos(n\omega t + \pi - \phi_n))]$$

Next, using the identity $\Rightarrow \cos a - \cos b = -2\sin\left(\frac{a+b}{2}\right)\sin\left(\frac{a-b}{2}\right)$ $$V_{out} = 8NA \times 10^{-8} \times$$

$$fB_s\sum_{n=1}^{\infty}\frac{\sin\left(\frac{n\pi B_s}{2\mu H_p}\right)}{\frac{n\pi B_s}{2\mu H_p}}\left[\sin\left(n\omega t + \frac{n\pi}{2}\right)\sin\left(\frac{n\pi}{2} + \phi_n\right) + \sin\left(n\omega t + \frac{n\pi}{2}\right)\sin\left(\frac{n\pi}{2} - \phi_n\right)\right]$$

Now, using the identity $\Rightarrow \sin a + \sin b = 2\sin\left(\frac{a+b}{2}\right)\cos\left(\frac{a-b}{2}\right)$ $$V_{out} = 16NA \times 10^{-8} \times$$

$$fB_s\sum_{n=1}^{\infty}\frac{\sin\left(\frac{n\pi B_s}{2\mu H_p}\right)}{\frac{n\pi B_s}{2\mu H_p}}\sin\left(n\omega t + \frac{n\pi}{2}\right)\sin(\phi_n) + \cos\left(\frac{n\pi}{2}\right)$$

Then by substituting $\Rightarrow \phi_n = \frac{n\pi H_o}{2H_p}$ each component of output voltage is represented by:

$$a_n = NA \times$$

$$10^{-8}\left(\frac{32\mu fH_p}{n\pi}\right)\sin\left(\frac{n\pi H_s}{2H_p}\right)\sin\left(\frac{n\pi H_o}{2H_p}\right)\sin\left(n\omega t + \frac{n\pi}{2}\right)\cos\left(\frac{n\pi}{2}\right)$$

For $n = 1$, $\cos(n\pi/2) = 0$.
Therefore the fundamental component is zero; $a_1 = 0$.

The second harmonic can then be calculated from the following relationship:

$$a_2 = NA \times 10^{-8} \left( \frac{16\mu f H_p}{\pi} \right) \sin\left( \frac{\pi H_s}{H_p} \right) \sin\left( \frac{\pi H_o}{H_p} \right) \sin(2\omega t)$$

For $H_o \ll H_p \Rightarrow \sin\left( \frac{\pi H_o}{H_p} \right) = \frac{RH_o}{H_p}$ Then:

$$a_2 = NA \times 10^{-8} (16\mu f H_o) \sin\left( \frac{\pi H_s}{H_p} \right) \sin(2\omega t)$$

Thus, by having the core parameters, such as A, $\mu$, $H_s$, as well as the frequency (f) and the amplitude of the excitation current ($H_p$) all held constant, the second harmonic then becomes linearly proportional to the field generated by the line current in the current carrying conductor 22.

It is to be understood that due to the toroidal shape of the respective first and second integral toroidal sections 26 and 30 and the lack of discontinuities within the flow path of the magnetic flux within each of the first and second integral toroidal sections 26 and 30, the magnetic behavior that takes place in the integral toroidal sections 26 and 30 will be more repeatable and thus more accurate. The respective settling points along the magnetic curves associated with each of the first and second integral toroidal sections 26 and 30 that correspond to zero (H=0 on the chart in FIG. 7) will be more repeatable from measurement to measurement. When the settling point varies from pts. 4 and 9 when there is no line current flowing in the current carrying conductor 22, it is known as zero errors. When these zero errors occur, measurements become inaccurate due to the variances erroneously influencing the quantities ΔB1+/− and ΔB2+/−. The design of the magnetic core 20 in the present invention overcomes the inadequacies of the prior art relating to poor saturation and problems with zero errors.

In referring to FIG. 8, an electrical schematic illustrates the electrical coupling of the first and second sets of windings L1 and L2, L3 and L4 respectively, to the first and second integral toroidal sections 26 and 30 of the magnetic core 20 which form a circuit. The directional arrows AA and BB in the first and second integral toroidal sections 26 and 30, respectively, indicate the direction of magnetic flux flow therein. An excitation current source 50 is electrically coupled to the first and second sets of windings L1 and L2, L3 and L4, respectively, at a pair of input terminals 53, also indicated by the letters A and D, so as to provide an excitation current thereto. Output terminals 52 are positioned between the first and second integral toroidal sections 26 and 30 to facilitate the detection of output voltages corresponding to line currents flowing through the current carrying conductor 22.

In now referring to FIG. 17, a block diagram of the hybrid non-contact clamp-on current meter can be seen illustrated for clarity. The magnetic core 20 and associated windings L1 and L2, L3 and L4 can be seen as configured with the additional electronics that form the hybrid non-contact clamp-on current meter. A drive means 60 can be seen to include a drive circuit 50 and a detector circuit 62. The drive circuit 50 having terminals E and F which are electrically coupled to the pair of input terminals A and D of the magnetic core 20. The drive circuit 50 is formed generally of a standard signal generator circuit commonly used in the industry. The drive circuit 50 provides an excitation current to the magnetic core 20 wherein the excitation current flows through the windings L1, L2, L3 and L4 so to produce a magnetic flux in the first and second integral toroidal sections 26 and 30 thereby placing the magnetic core 20 in a saturated state.

The drive circuit 50 is enabled/disabled by way of a disable circuit 64 which is electrically coupled to a terminal J of the drive means 60. The drive circuit 50 is enabled when the hybrid non-contact clamp-on current meter is operating in the low frequency mode for measuring DC to low frequency currents. Further, the detector circuit 62 of the drive means 60 can be seen to include input terminals G and H and an output terminal I.

The hybrid non-contact clamp-on current meter further includes a switching means, referenced generally by numeral 66, and an amplification means generally referenced by numeral 68. The switching means 66 is comprised generally of a first switch 70, a second switch 72, a switch control circuit 74, the disable circuit 64 and a frequency counter 76. The first switch 70 includes an input terminal 70a and a first and second output terminal 70b and 70c, respectively. The second switch 72 includes a first and second input terminal 72a and 72b, respectively, and an output terminal 72c. The amplification means 68 can be seen to include a low frequency amplifier 78, a high frequency amplifier 80 and a buffer amplifier 82.

The input terminal 70a of the first switch 70 is electrically coupled to the output terminal B of the magnetic core 20. The first output terminal 70b of the first switch 70 is electrically coupled to terminal H of the detector circuit 62. The second output terminal 70c of the first switch 70 is coupled to the high frequency amplifier 80. The output of the high frequency amplifier 80 is, in turn, electrically coupled to the second input terminal 72b of the second switch 72 and the output terminal 72c of the second switch 72 is electrically coupled to the buffer amplifier 82.

Further, a load resistor 84 is electrically coupled between the output terminal C of the magnetic core 20 and the input of the high frequency amplifier 80. As for the output of the detector circuit 62, terminal I of the detector circuit 62 is electrically coupled to the input of the low frequency amplifier 78. The output of the low frequency amplifier 78 is then, in turn, electrically coupled to the first input terminal 72a of the second switch 72.

To complete the switching means 66 configuration, the frequency counter 76 is electrically coupled between the input of the buffer amplifier 82 and the switch control circuit 74. The switch control circuit 74, in turn, is electrically coupled to the disable circuit 64, the first switch 70 and the second switch 72 so as to enable the switch control circuit 74 to transmit controlling signals thereto.

When the hybrid non-contact clamp-on current meter is operating in the low frequency mode, the first and second switches 70 and 72 are in position one as indicated by numeral 1 in the switches 70 and 72 in FIG. 17. Conversely, when the hybrid non-contact clamp-on current meter is operating in the high frequency mode, the switches 70 and 72 are set in position two as referenced by numeral 2 in the switches 70 and 72 as indicated in FIG. 17. Further, when the hybrid non-contact clamp-on current meter is operating in the high frequency mode, the disable circuit 64 is sending a DC voltage to terminal J of the drive means 60 wherein the drive circuit 50, in correspondence thereto, is disengaged thereby removing the excitation current from the magnetic core 20.

Now that the electrical configuration has been described in detail, the operation can be readily understood. When the hybrid non-contact clamp-on current meter is operating in the low frequency mode, the magnetic core 20 operates as described previously above wherein the saturation technique is utilized for current measurement. Hence, the magnetic core 20 is driven into saturation by applying the excitation current from the drive circuit 50 to the first and second sets of windings L2 and L2, L3 and L4 prior to the placing of a current carrying conductor 22 in position to be measured.

Once the current carrying conductor 22 is placed in position, the line current therein is sensed by the magnetic core 20 with a resultant output voltage presented at the output terminals B and C in accordance with the saturation technique previously described. The first and second switches 70 and 72 would be in position one so as to present the output voltage to terminals G and H of the detector circuit 62. The detected output voltage is then amplified by way of the low frequency amplifier 78 and transmitted through the second switch 72 to the buffer amplifier 82 whereupon an output signal, proportional in amplitude and polarity, is presented.

However, when the line current in the current carrying conductor 22 is of a high frequency nature (into the Megahertz range, ultimately limited only by the core material), the frequency counter 76, that is constantly tracking the frequency of the output signal, will transmit a representative voltage logic to the switch control circuit 74 indicating that a high frequency is now being sensed. Upon the frequency counter 76 indicating to the switch control circuit 74 that a high frequency current is being sensed, the switch control circuit 74 then, in turn, sends corresponding control signals to the first and second switches 70 and 72 thereby activating the switches 70 and 72 to toggle to position two. Additionally, the switch control circuit 74 sends a control signal to the disable circuit 64 which, in turn, instructs the drive means 60 to disengage the drive circuit 50 so as to remove the excitation current from the magnetic core 20. Thus, with the excitation current removed from the magnetic core 20, the magnetic core is left to function as a current transformer with the windings L1 and L2, L3 and L4 being configured in a common bridge configuration having a load resistor 84.

Figure 18:
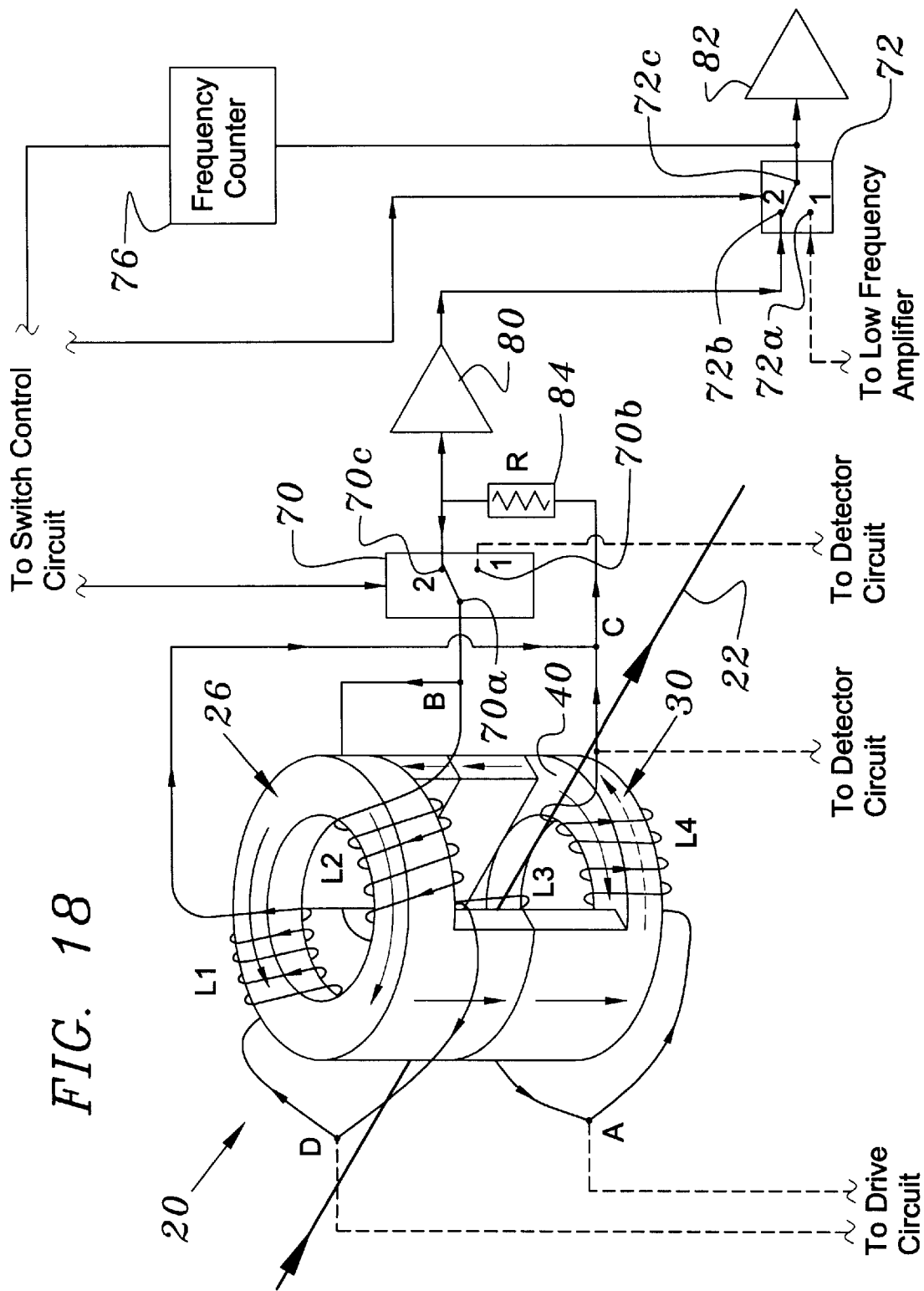
FIG. 18 is a detailed view of the magnetic core and first and second sets of windings positioned thereon illustrating the current flow directions through the windings and the magnetic flux flow directions present in the magnetic core as occurs when the hybrid non-contact current meter is operating in the high frequency mode as a current transformer, and the magnetic core is further illustrated along with the resulting high frequency signal path through the first and second switches, the high frequency amplifier and the buffer amplifier.

In now referring to FIG. 18, the hybrid non-contact clamp-on current meter can be seen in its equivalent electrical configuration when operating in the high frequency mode with the first and second switches 70 and 72 set to position two and the excitation current from the drive circuit 50 disengaged. For clarity purposes, the drive circuit 50 and the detector circuit 62 of the drive means 60 are not shown. Further, the disable circuit 64, the switch control circuit 74 and the low frequency amplifier 78 are not shown in the FIG. 18 as well. Thus, the lines to the drive circuit 50, the detector circuit 62 and the low frequency amplifier 78 are shown in phantom.

The magnetic core 20 is illustrated in detail so as to depict the direction of current flow through the windings L1 and L2, L3 and L4 and the first and second integral toroidal sections 26 and 30 of the magnetic core 20. Directional arrows are shown on the windings L1, L2, L3 and L4 to indicate current flow and directional arrows are shown on the magnetic core 20 to indicate the flow of magnetic flux B in the first and second integral toroidal sections 26 and 30. With the first and second switches 70 and 72 set in position two for high frequency mode operation, current flowing through the windings L1, L2, L3 and L4, generated by way of the line current flowing in the current carrying conductor 22 being coupled by way of the magnetic core 20, is caused to flow through the load resistor 84. The current flowing through the load resistor 84 is then amplified by way of the high frequency amplifier 80 and further transmitted through the second switch 72 to the buffer amplifier 82 whereupon an output signal, proportional in amplitude and polarity to the line current, is presented.

In short, the hybrid non-contact clamp-on current meter automatically switches from high frequency and low frequency modes of operation depending upon the frequency of the line current being measured in the current carrying conductor 22. The windings L1, L2, L3 and L4 positioned on the magnetic core 20 are notably utilized in a standard bridge configuration in both high frequency and low frequency modes of operation. Thus, the same magnetic core 20 with windings L1, L2, L3 and L4 positioned thereon can be used to perform current measurements from direct current to low frequencies utilizing the saturation technique as well as perform current measurements on high frequency line currents in the Megahertz range by operating as a current transformer.

The present disclosure includes that contained in the appended claims as well as that of the foregoing description. Although this invention has been described in its preferred form with a certain degree of particularity, it should be understood that the present disclosure of the preferred form has been made only by way of example and that numerous changes in the details of construction and combination and arrangement of parts may be resorted to without departing from the spirit and scope of the invention.

Now that the invention has been described,

What is claimed is:

1. A current meter operable in a low frequency measurement mode and a high frequency measurement mode for measuring the flow of low and high frequency line current, respectively, through a current carrying conductor, said current meter comprising in combination:

a magnetic core, said magnetic core including a first portion having a first toroidal section, a second portion having a second toroidal section, a first set of windings positioned on said first toroidal section, a second set of windings positioned on said second toroidal section and being electrically coupled to said first set of windings, and a pair of input and output terminals electrically coupled to said first and second sets of windings;

a drive means including a drive circuit and a detector circuit, said drive circuit including means for providing an excitation current to said first and second sets of windings during the low frequency measurement mode, said drive circuit and said detector circuit of said drive means being electrically coupled to said pairs of input and output terminals of said magnetic core, respectively; and a switching means for changing the mode of operation of said current meter from said low frequency measurement mode to said high frequency measurement mode when the frequency of said line current exceeds a predetermined amount, said switching means being electrically coupled to said drive means to disable said drive means during high frequency measurement mode.

2. The current meter as recited in claim 1, wherein said first and second sets of windings are configured in a bridge configuration.

3. The current meter as recited in claim 1, wherein said current meter further includes an amplification means for amplifying the output of said magnetic core, said amplification means being electrically coupled relative to said output terminals, said switching means and said drive means.

4. The current meter as recited in claim 3, wherein said switching means is comprised of a switch control circuit and a first switch having an input terminal electrically coupled to one of said output terminals of said magnetic core, a first output terminal electrically coupled to said drive means and a second output terminal electrically coupled to said amplification means, a second switch having an output terminal and first and second input terminals electrically coupled to said amplification means, said switch control circuit being electrically coupled to said first and second switches, whereby said switch control circuit facilitates activating said first and second switches in accordance with the required operating mode of said current meter.

5. The current meter as recited in claim 4, wherein said switching means is manually activated.

6. The current meter as recited in claim 4, wherein said amplification means is comprised of a high frequency amplifier, a low frequency amplifier and a buffer amplifier, said high frequency amplifier being electrically coupled between said second output terminal of said first switch and said second input terminal of said second switch, said low frequency amplifier being electrically coupled between said drive means and said first input terminal of said second switch, and said buffer amplifier being electrically coupled to said output terminal of said second switch.

7. The current meter as recited in claim 4, wherein said switching means further includes a frequency counting means for tracking the frequency of the output signal and providing a representative signal to said switch control circuit so to automatically switch the mode of operation in response to the line current, said frequency counting means being electrically coupled between said output terminal of said second switch and said switch control circuit.

8. The current meter as recited in claim 4, wherein said switching means further comprises a disable circuit electrically coupled between said switch control circuit and said drive means, said disable circuit facilitating the application of the excitation current to said first and second sets of windings.

9. The current meter as recited in claim 3, wherein said current meter further includes a load resistor electrically coupled between said output terminals of said magnetic core and said amplification means, whereby said load resistor is bypassed when said current meter is operated in the low frequency mode.

10. The current meter as recited in claim 1, wherein said first toroidal section includes a first internal side and a first pair of opposing side walls extending from said first internal side, and said second toroidal section includes a second internal side and a second pair of opposing side walls extending from said second internal side, said first pair of opposing side walls further including a first and second cut portion positioned therebetween, and said second pair of opposing side walls further including a third and fourth cut portion, whereby said second pair of opposing side walls are in cooperative alignment with and coupled to said first pair of opposing side walls, said first, second, third and fourth cut portions thereby forming an aperture, said aperture facilitating the placement of said current carrying conductor therethrough.

11. The current meter as recited in claim 1, wherein said drive means is comprised of a signal generator and a detector circuit, said signal generator being electrically coupled to said input terminals of said magnetic core and providing the excitation current thereto, said detector circuit being coupled to said output terminals of said magnetic core and detecting the output signal from said magnetic core when operating said current meter in the low frequency mode.

12. A current meter operable in a low frequency measurement mode and high frequency measurement mode for measuring the flow of low and high frequency line current, respectively, through a current carrying conductor, said current meter comprising in combination:

a magnetic core means for electrically coupling and sensing the line current flowing through the current carrying conductor;

a first set of windings positioned on said magnetic core means;

a second set of windings positioned on said magnetic core means, said second set of windings being electrically coupled to said first set of windings, said first and second sets of windings further including a pair of input and output terminals;

a drive means including a drive circuit and a detector circuit, said drive circuit including means for providing an excitation current to said first and second sets of windings during the low frequency measurement mode, said drive circuit and said detector circuit of said drive means being electrically coupled to said pairs of input and output terminals, respectively; and a switching means for changing the mode of operation of said current meter from said low frequency measurement mode to said high frequency measurement mode when the frequency of said line current exceeds a predetermined amount in correspondence to the line current, said switching means being electrically coupled to said drive means to disable said drive means during high frequency measurement mode.

13. The current meter as recited in claim 12, wherein said first and second sets of windings are configured in a bridge configuration.

14. The current meter as recited in claim 12, wherein said current meter further includes an amplification means for amplifying the output of said magnetic core, said amplification means being electrically coupled relative to said output terminals, said switching means and said drive means.

15. The current meter as recited in claim 14, wherein said switching means is comprised of a switch control circuit and a first switch having an input terminal electrically coupled to one of said output terminals of said magnetic core, a first output terminal electrically coupled to said drive means and a second output terminal electrically coupled to said amplification means, a second switch having an output terminal and first and second input terminals electrically coupled to said amplification means, said switch control circuit being electrically coupled to said first and second switches, whereby said switch control circuit facilitates activating said first and second switches in accordance with the required operating mode of said current meter.

16. The current meter as recited in claim 15, wherein said switching means is manually activated.

17. The current meter as recited in claim 15, wherein said switching means further includes a frequency counting means for tracking the frequency of the output signal and providing a representative signal to said switch control circuit so to automatically switch the mode of operation in response to the line current, said frequency counting means being electrically coupled between said output terminal of said second switch and said switch control circuit.

18. The current meter as recited in claim 12, wherein said magnetic core means is comprised of a first portion having a first toroidal section, a second portion having a second toroidal section, said first set of windings being positioned on said first integral toroidal section and said second set of windings being positioned on said second integral toroidal section, whereby said magnetic core means facilitates encircling said current carrying conductor, the excitation current flowing through said first set of windings producing a flux in said first integral toroidal section and the excitation current flowing through said second set of windings producing a flux in said second integral toroidal section flowing in an opposite direction as in said first integral toroidal section.

19. The current meter as recited in claim 18, wherein said first and second toroidal sections are in a continuous toroid shape so as to facilitate having a more thorough flux saturation therein thereby reducing the occurrence of zero errors in measurements.

20. A method for measuring a line current in a current carrying conductor comprising the steps of:

providing a magnetic core means for electrically coupling and sensing the line current flowing through the current carrying conductor with a first set of windings positioned on said magnetic core means and a second set of windings positioned on said magnetic core means, said second set of windings being electrically coupled to said first set of windings;

providing an excitation current to said first and second sets of windings, said excitation current facilitating the producing of flux in said magnetic core means;

placing a current carrying conductor in relative close proximity to said magnetic core means to facilitate the sensing of the current in the current carrying conductor;

switching the mode of operation of said current meter from a low frequency measurement mode to a high frequency measurement mode in correspondence to the frequency of the line current in the current carrying conductor; and detecting an output signal that is proportional in amplitude and polarity to the line current being measured.

21. The method as recited in claim 20, wherein the step of providing a magnetic core means having said first and second sets of windings positioned thereon further includes the step of electrically coupling said first and second sets of windings in a bridge configuration.

22. The method as recited in claim 20, wherein the step of switching the mode of operation of said current meter further includes the step of tracking the frequency of the output signal and changing the mode of operation accordingly.

23. The method as recited in claim 20, further including the step of amplifying the output of the magnetic core means.

24. The method as recited in claim 20, wherein the step of providing a magnetic core means is further comprised of the steps of providing a first portion and a second portion, said first portion including a first toroidal section having a first internal side, and a first pair of opposing side walls extending therefrom, said second portion including a second toroidal section having a second internal side, and a second pair of opposing side walls extending therefrom, said first and second portions being coupled together at said first and second pairs of opposing side walls thereby forming an aperture therethrough, whereby said second set of windings produces a flux in said second toroidal section of which flows in an opposite direction than in the first toroidal section.

* * * * *